United States Patent [19]
Yamashita et al.

[11] Patent Number: 4,742,379
[45] Date of Patent: May 3, 1988

[54] HEMT WITH ETCH-STOP

[75] Inventors: Yoshimi Yamashita, Sagamihara; Kinjiro Kosemura, Atsugi; Hidetoshi Ishiwari, Ebina; Sumio Yamamoto, Yokohama; Shigeru Kuroda, Hadano, all of Japan

[73] Assignee: Fujitsu Limited, Kanagawa, Japan

[21] Appl. No.: 676,359

[22] Filed: Nov. 29, 1984

[30] Foreign Application Priority Data

Nov. 29, 1983 [JP] Japan ................. 58-224650
Nov. 29, 1983 [JP] Japan ................. 58-224634

[51] Int. Cl.$^4$ ............................ H01L 29/80
[52] U.S. Cl. .......................... 357/22; 357/16
[58] Field of Search ............ 357/22, 16, 22 A, 16; 156/633, 631, 656

[56] References Cited

U.S. PATENT DOCUMENTS 4,163,237 7/1979 Dingle et al. ............. 357/22 A
4,635,343 1/1987 Kuroda ..................... 29/571

OTHER PUBLICATIONS

Hikosaka et al., *Selective Dry Etching of AlGaAs–GaAs Heterojunction*, Jap. Journal Appl. Phy, vol. 20, No. 11, Nov. 1981, pp. L847–L850.
"(Invited) MBE-Grown GaAs/N-AlGaAs Heterostructures and Their Application to High Electron Mobility Transistors", Japanese Journal of Applied Physics, vol. 21 (1982), Supplement 21-1, pp. 161-168.

*Primary Examiner*—William D. Larkins
*Attorney, Agent, or Firm*—Armstrong, Nikaido, Marmelstein & Kubovcik

[57] ABSTRACT

A compound semiconductor device comprises an enhancement-mode transistor and a depletion-mode transistor, each of which has a heterojunction and utilizes a two-dimensional electron gas. The method of producing the device comprises the steps of: forming an undoped GaAs channel layer on a semi-insulating GaAs substrate; forming an N-type AlGaAs electron-supply layer so as to form the heterojunction; forming an N-type GaAs layer; forming an AlGaAs layer; selectively etching the AlGaAs layer to form a recess; performing an etching treatment using an etchant which can etch rapidly GaAs and etch slowly AlGaAs to form simultaneously grooves for gate electrodes of the enhancement-mode transistor and the depletion-mode transistor, the bottoms of the grooves being in the N-type AlGaAs layer and the distance between the bottoms being equal to the thickness of the AlGaAs layer; and forming simultaneously the gate electrodes in the grooves.

10 Claims, 7 Drawing Sheets

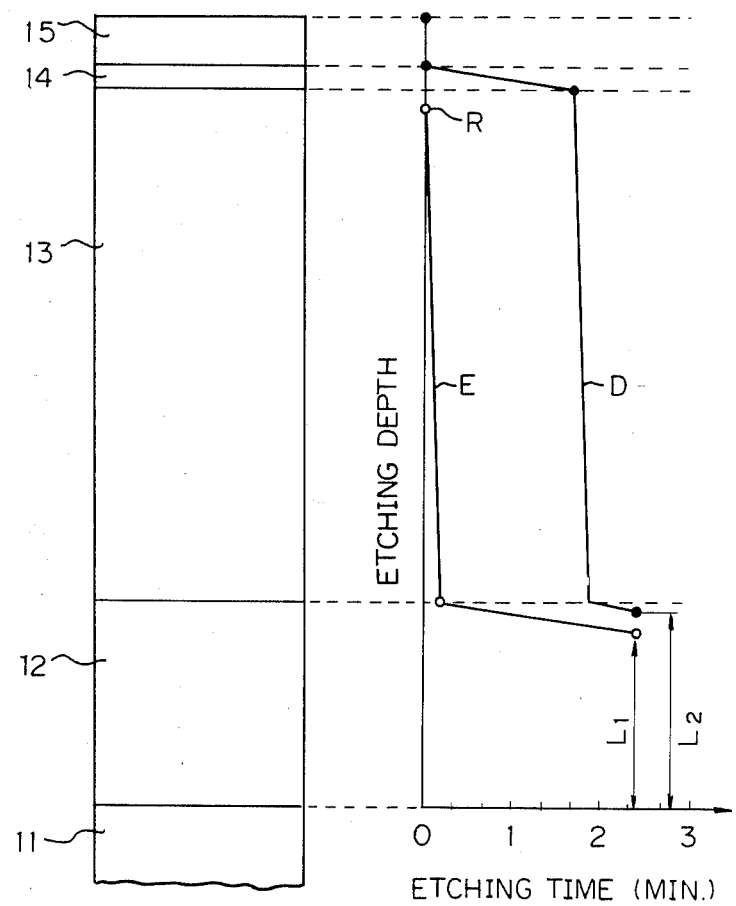

HEMT WITH ETCH-STOP

BACKGROUND OF THE INVENTION

1. Field of the Invention

The present invention relates to a semiconductor device comprising an enhancement-mode field-effect transistor and a depletion-mode field-effect transistor, each of which has a heterojunction and uses a two-dimensional electron gas.

2. Description of the Related Art

In order to increase the performance of a computer, it is preferable to increase the operating speed of a semiconductor device and to decrease the power consumption thereof. Therefore, many proposals have been made on transistors made of a compound semiconductor such as gallium-arsenide (GaAs) since the carrier mobility thereof is far greater than that of silicon (Si), which is generally used in current semiconductor devices. In the transistors of a compound semiconductor, field-effect transistors, particularly Schottky barrier-type field-effect transistors, are generally produced since the production process thereof is easier than that of bipolar transistors.

In a field-effect transistor made of GaAs or Si and having a conventional structure, carriers move in a semiconductor crystal in which impurity ions exist. The moving carriers are scattered by the lattice vibration and the impurity ions, whereby the carrier mobility is limited. The lattice scattering effect can be reduced by lowering the temperature, but the ionized impurity scattering effect is not reduced.

It is possible to eliminate the ionized impurity scattering effect by separating the region of carrier movement from the region doped with impurities with the interface of a heterojunction. The combination of the low temperature and the heterojunction increases the carrier mobility so that such a heterojunction-type field-effect transistor can be operated faster than the above-mentioned conventional field-effect transistors.

For example, the heterojunction-type field-effect transistor comprises a semi-insulating GaAs substrate, an undoped GaAs layer (semiconductor channel layer), an N-type aluminum-gallium-arsenide layer (AlGaAs; electron-supply layer), and an N-type GaAs layer (contact layer), which layers are formed in sequence on the GaAs substrate by a molecular beam epitaxy (MBE) method or a metal organic chemical vapor deposition (MOCVD) method. The undoped GaAs layer and the N-type AlGaAs layer form the heterojunction. The N-type AlGaAs layer has an electron affinity smaller than that of the undoped GaAs layer and contains donor impurities. The N-type GaAs layer and, if necessary, the N-type AlGaAs layer are selectively etched to form a groove for a gate electrode so that a predetermined distance between the top surface of the undoped GaAs layer (i.e., the interface of the heterojunction) and the bottom of the gate electrode is obtained. The distance has an influence on the gate threshold voltage of the field-effect transistor. In the above-mensioned heterojunction-type field-effect transistor, a two-dimensional electron gas is generated in the undoped GaAs layer at the heterojunction interface by transferring electrons into the undoped GaAs layer from the N-type AlGaAs layer and serves as a channel. The electron density of the channel is controlled by an applied voltage of the gate so that the impedance between the source electrode and the drain electrode is controlled.

When a semiconductor device comprising an enhancement-mode transistor and a depletion-mode transistor is produced by utilizing the above-mentioned heterojunction-type field-effect transistor, namely, when at least two heterojunction-type field-effect transistors having different gate threshold voltages are produced on the same semi-insulating GaAs substrate by varying a thickness of the N-type GaAs and, if necessary, the N-type AlGaAs under the gate electrodes, it is necessary to form suitable grooves for the gate electrodes by accurately etching the layers formed on the undoped GaAs layer, respectively. However, such etching process is complicated, and accurate etching control is difficult.

SUMMARY OF THE INVENTION

An object of the present invention is to simplify the production of a semiconductor device comprising an enhancement-mode transistor and a depletion-mode transistor, which are heterojunction-type field-effect transistors, and to utilize a two-dimensional electron gas.

Another object of the present invention is to provide an improved method of producing a semiconductor device so as to accurately control the gate threshold voltages and increase the production yield.

A further object of the present invention is to provide a semiconductor device produced by the improved method.

The above and other objects of the present invention are attained by providing a method of producing a semiconductor device which comprises an enhancement-mode transistor and a depletion-mode transistor, has a heterojunction, and utilizes a two-dimensional electron gas, comprising the steps of: forming a semiconductor channel layer, in which the two-dimensional electron gas is generated, on a semi-insulating compound semiconductor substrate; forming an electron-supply layer on the semiconductor channel layer, which layers form the heterojunction; forming a first semiconductor layer having a composition different from the electron-supply layer on the electron-supply layer; selectively etching at least the semiconductor layer to form grooves of the enhancement-mode transistor and of the depletion-mode transistor, respectively; and forming the gate electrodes in the grooves; characterized in that a second semiconductor layer having a composition different from the first semiconductor layer is formed on the first semiconductor layer after the formation step thereof, a portion of the second semiconductor layer corresponding to the gate region of the enhancement-mode transistor is selectively etched to form a recess, and in the etching step, the grooves are simultaneously etched by using an etchant which can etch rapidly the first semiconductor layer and etch slowly the second semiconductor layer and the electron-supply layer so that the exposed portion of the first semiconductor layer and a portion of the electron-supply layer having a thickness corresponding to the thickness of the second semiconductor layer are etched to form the groove for the gate electrode of the enhancement-mode transistor and a portion of the second semiconductor layer and a portion of the first semiconductor layer are etched to form the groove for the depletion-mode transistor, in which the electron-supply layer is exposed. In this case, if the second semiconductor layer is of the same material as the electron-supply layer, the thickness of the second semiconductor layer is equal to the difference in distance between the interface of the heterojunction and the bottom of the gate electrodes of the enhancement-mode transistor and the depletion-mode transistor.

It is possible to make the difference in distance greater by forming a third semiconductor layer and a fourth semiconductor layer between the electron-supply layer and the first semiconductor layer, the third semiconductor layer being of the same material as the first semiconductor layer and being formed on the electron-supply layer and the fourth semiconductor layer being of the same material as the second semiconductor layer, having the same thickness as the second semiconductor layer, and being formed on the third semiconductor layer.

BRIEF DESCRIPTION OF THE DRAWINGS

The present invention will be more apparent from the description of the preferred embodiments set forth below, with reference to the accompanying drawings, in which:

FIG. 5A is a schematic layer structure of the embodiment of the present invention;

FIG. 5B is a graph showing the etching process;

DESCRIPTION OF THE PREFERRED EMBODIMENTS

Before describing the preferred embodiments of the present invention, a prior technique for a semiconductor device which comprises an enhancement-mode transistor and a depletion-mode transistor, has a heterojunction, and utilizes a two-dimensional electron gas is discussed.

Figure 1:
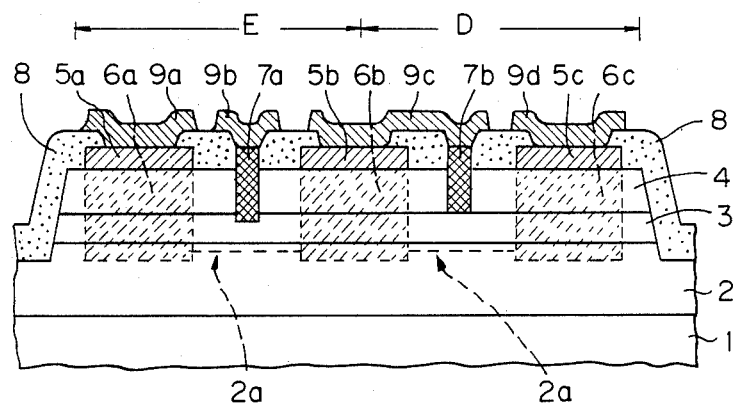
FIG. 1 is a schematic sectional view of a conventional semiconductor device comprising an enhancement-mode transistor and a depletion-mode transistor.

As is illustrated in FIG. 1, for example, an inverter has a conventional structure comprising an enhancement-mode field-effect transistor in an "E" section and a depletion-mode field-effect transistor in a "D" section. The inverter has the electric circuit of FIG. 2, in which "Tr$_1$" corresponds to a driven element of the enhancement-mode field-effect transistor and "Tr$_2$" corresponds to a load element of the depletion-mode field-effect transistor.

Each of the transistors comprises a semi-insulating GaAs substrate 1, an undoped GaAs layer (semiconductor channel layer) 2, an N-type AlGaAs layer (electron-supply layer) 3, and an N-type GaAs layer (contact or cap layer) 4, which layers are formed in sequence on the substrate 1 by the MBE method or the MOCVD method. The formed layers are selectively etched to form an active mesa portion isolated from another active mesa portion (not shown), as shown in FIG. 1. It is possible to use another isolation structure, e.g., an insulator region which is doped with oxygen ions or protons. Source and drain electrodes 5a, 5b, and 5c of AuGe/Au, AuGe/Ni/Au, or AuGe/Ni are formed on the N-type GaAs layer 4. Alloyed regions 6a, 6b, and 6c are formed under the electrodes 5a, 5b, and 5c by a heat treatment. The enhancement-mode transistor has the source electrode 5a and the drain electrode 5b, and the depletion-mode transistor has the source electrode 5b and the drain electrode 5c. In this case, the electrode 5b serves as a common electrode. A gate electrode 7a of the enhancement-mode transistor is formed in a groove which extends into a portion of the N-type AlGaAs layer 3 through the N-type GaAs layer 4, while a gate electrode 7b of the depletion-mode transistor is formed in another groove which extends to the top surface of the N-type AlGaAs layer 3 through the N-type GaAs layer 4. An insulating layer 8 of, e.g., silicon dioxide (SiO$_2$) is formed, and suitable internal connector lines 9a, 9b, and 9c are formed.

In the inverter, a two-dimensional electron gas 2a is generated in the undoped GaAs layer 2 at the interface of the heterojunction (of the GaAs layer and the AlGaAs layer) between the alloyed regions 6a, 6b, and 6c, as shown in FIG. 1. The two-dimensional electron gas 2a serves as a channel of the field-effect transistor and is controlled by the gate voltage.

Figure 3:
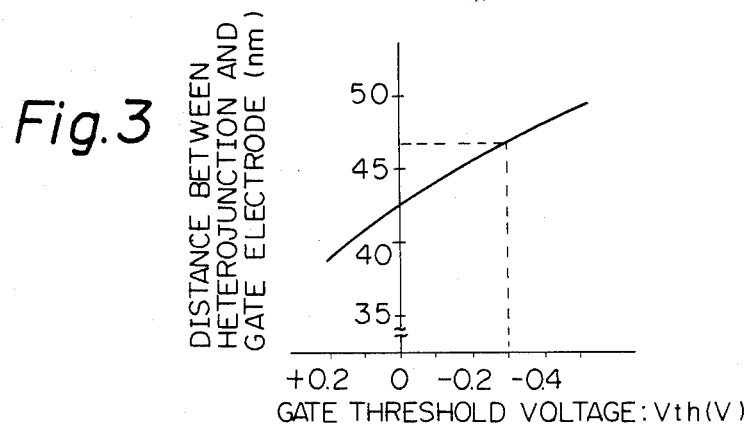
FIG. 3 is a graph showing the relationship between the gate threshold voltage and the distance between the interface of the heterojunction and the bottom of the gate electrode.

In the case of the above-mentioned heterojunction-type field-effect transistor utilizing the two-dimensional electron gas, the gate threshold voltage V$_{th}$ is related to the distance between the interface of the heterojunction and the bottom of the gate electrode, for example, as shown in FIG. 3. An ideal gate threshold voltage of the enhancement-mode transistor is zero (i.e., V$_{th}$=0 V); therefore, the distance is about 42.5 nm according to FIG. 3. When the gate threshold voltage of the depletion-mode transistor is, e.g., −0.3 volts (i.e., V$_{th}$=−0.3 V), the distance is about 46.5 nm.

In order to obtain suitable distances between the heterojunction interface and the bottom of the gate electrodes for predetermined gate threshold voltages of the enhancement-mode and depletion-mode transistors, it is necessary to accurately etch the N-type GaAs layer 4 and the N-type AlGaAs layer 3 to form grooves for the gate electrodes having different depths. The etching step for a groove and the formation step of a gate electrode are repeated twice for the enhancement-mode and depletion-mode transistors. In this case, there are problems regarding accurate control of the etched depth and many complicated production steps. As a proposal, the AlGaAs layer 3 is adopted for use as an etching-stopping layer for the formation of the groove of the gate electrode 7b of the depletion-mode transistor, as shown in FIG. 1. Therefore, the groove for the depletion-mode transistor can be relatively easily formed, but the etching process for the groove for the enhancement-mode transistor should be stopped so as to obtain a groove having a predetermined depth in the AlGaAs layer 3. In order to carry out exactly stoppage of the etching, the current between the source and the drain is often monitored. Since the monitoring measurement must be performed outside of the etching apparatus, the production efficiency is remarkably reduced. Further more, when many enhancement-mode and depletion-mode transistors are produced on a substrate, the variation of the gate threshold voltage must be minimized.

Referring to FIGS. 4A through 4G and 5A and 5B, a semiconductor device comprising enhancement-mode and depletion-mode heterojunction-type field-effect transistors and a method of producing the device according to a preferred first embodiment of the present invention are now explained.

Figure 4A:
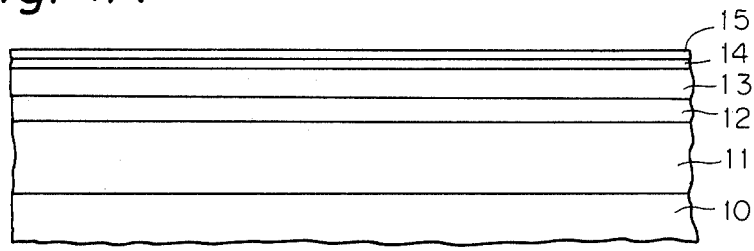
FIGS. 4A through 4G are schematic sectional views of a semiconductor device comprising an enhancement-mode transistor and a depletion-mode transistor in various stages of production in accordance with an embodiment of the present invention.

As illustrated in FIG. 4A, on a semi-insulating GaAs substrate 10, an undoped GaAs layer 11 is formed by the MBE method or the MOCVD method. The GaAs layer 11 has a thickness of from 0.1 to 0.3 μm. An N-type AlGaAs layer (electron-supply layer) 12 is epitaxially grown on the undoped GaAs layer 11 so that the AlGaAs layer 12 and the GaAs layer 11 form a heterojunction. For example, the $Al_xGa_{1-x}As$ layer 12 is doped with Si impurities of a dose of from $1\times10^{17}$ to $2\times10^{18}$ cm$^{-3}$ and has a thickness of e.g., 48 nm, which corresponds to the distance between the heterojunction interface and the bottom of the gate electrode of the depletion-mode transistor plus an overetching depth during the etching step for grooves, wherein "x" is 0.3. Then an N-type GaAs layer 13 is epitaxially grown on the AlGaAs layer 12. The GaAs layer 13 has a thickness of, e.g., approximately 100 nm and is doped with Si impurities of a dose of from $1\times10^{17}$ to $2\times10^{18}$ cm$^{-3}$. The layers 11, 12, and 13 are similar to those of a conventional semiconductor device, shown, e.g., in FIG. 1.

In accordance with the embodiment of the present invention, an N-type AlGaAs layer 14 is epitaxially grown on the GaAs layer 13. The AlGaAs layer 14 has the substantially same composition as that of the AlGaAs layer 12 and has a thickness corresponding to the difference in distance between the heterojunction interface and the gate electrode bottom for the enhancement-mode transistor and the depletion-mode transistor, e.g., 4 nm. An N-type GaAs layer 15 is epitaxially grown on the AlGaAs layer 14, as shown in FIG. 4A. The GaAs layer 15 serves as a cap-protecting layer to prevent the thickness and the surface properties of the AlGaAs layer 14 from undesirably changing due to a wafer surface treatment, such as an etching treatment, a cleaning treatment (involving the oxidation of Al), or the like. It is possible to adopt undoped AlGaAs and undoped GaAs for the layers 14 and 15, respectively, instead of N-type AlGaAs and N-type GaAs. The layers 12, 13, 14, and 15 are formed by the MBE method or the MOCVD method.

Figure 4B:
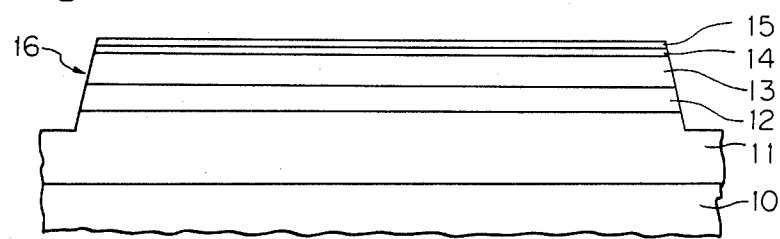

As illustrated in FIG. 4B, the formed layers 11 to 15 are selectively etched by a wet etching method or a dry etching method so as to form an isolated mesa portion 16 in which transistors are formed. The etching depth extends into the undoped GaAs layer 11 to attain isolation between elements. It is possible to adopt another isolation structure, e.g., an insulator region which is doped with oxygen ions or protons by an ion-implantation method.

Figure 4C:
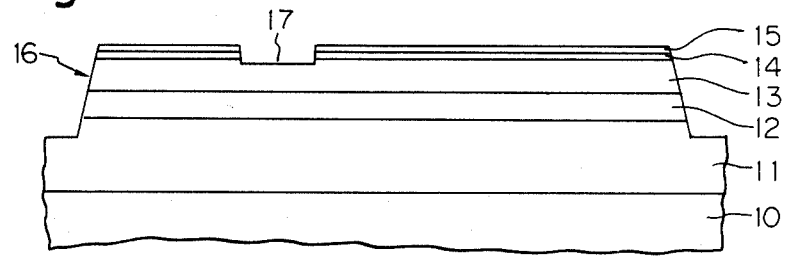

As illustrated in FIG. 4C, portions of the GaAs layer 15 and the AlGaAs layer 14 corresponding to a gate region of the enhancement-mode transistor are etched by a suitable etching method to form a recess 17 in which the N-type GaAs layer 13 is exposed. In this etching step, a small portion of the N-type GaAs layer 13 may be etched.

Figure 4D:
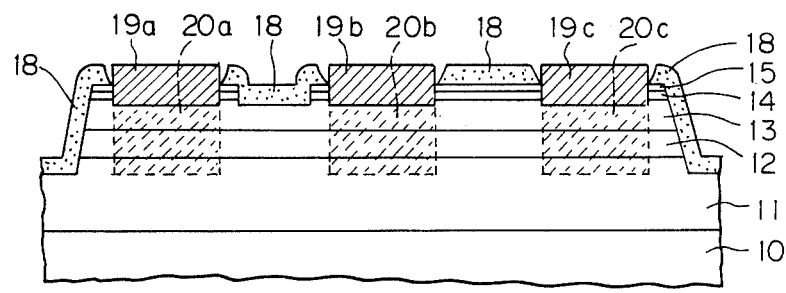

As illustrated in FIG. 4D, the exposed surface of the compound semiconductor sustrate including the mesa portion 16 is covered with an insulating protector film 18, e.g., of $SiO_2$. The film 18 is selectively etched by a conventional lithograph method to form openings for source and drain electrodes. In this case, the GaAs layer 15, the AlGaAs layer 14, and a portion of the N-type GaAs layer 13 are etched through the openings by a suitable etching method. Then ohmic contact electrodes 19a, 19b, and 19c are formed in the openings by depositing a multilayer metal of AuGe/Au, AuGe/Ni/Au, AuGe/Ni, or the like and patterning it by a lift-off method or a lithograph method. A heat treatment for alloying (e.g., at approximately 450° C. for 1 minute) is carried out to form alloyed regions 20a, 20b, and 20c coming into ohmic contact with a two-dimensional electron gas layer. The etching step of the layers 15, 14, and 13 is not always necessary.

Figure 4E:
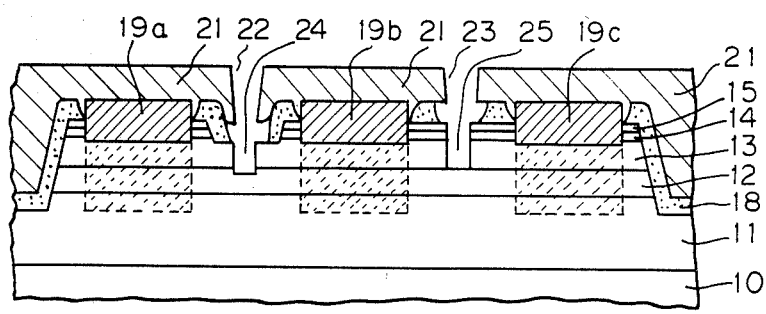

As illustrated in FIG. 4E, a resist film (preferably a positive photoresist film) 21 is applied on the entire exposed surface and is patterned to form openings 22 and 23 corresponding to gate regions of the enhancement-mode and depletion-mode transistors. The insulating protector ($SiO_2$) film 19 is etched through the openings 22 and 23 by a suitable etchant (e.g., a hydrofluoric acid). Then a groove 24 for the gate electrode of the enhancement-mode transistor and a groove 25 for the gate electrode of the depletion-mode transistor are formed by using a suitable etching method. According to the present invention, an etchant etching rapidly GaAs and slowly AlGaAs should be used in the etching method. In this case, it is preferable to apply a reactive ion etching method using an etchant gas of $CCl_2F_2$ and a diluent or carrier gas of helium (He) since a GaAs etching rate of from 500 to 600 nm/min and an AlGaAs etching rate of from 2 to 3 nm/min can be obtained.

The progress of the etching depth in the above-mentioned etching step is explained in detail with reference to FIGS. 5A and 5B. In FIG. 5B, the slanted lines E and D indicate the grooves for the gate electrodes of the enhancement-mode and depletion-mode transistors, respectively. The point R indicates the depth of the recess 17 (FIG. 4C). Since the etching rate of GaAs is much higher than that of AlGaAs, when the enhancement-mode groove 24 reaches the N-type AlGaAs layer 12, the depletion-mode groove 25 reaches into the AlGaAs layer 14. Thereafter, when the depletion-mode groove 25 reaches the N-type AlGaAs layer 12, the depth of the enhancement-mode groove 24 extends into the layer 12 by a length which is almost the same as the thickness of the AlGaAs layer 14. For a predetermined etching treatment time, the etching proceeds on the grooves 24 and 25, with the depth difference corresponding to the thickness of the AlGaAs layer 14 being maintained. As a result of etching, the grooves 24 and 25 are simultaneously completed so as to attain predetermined distances $L_1$ and $L_2$ between the heterojunction interface and the bottom of the grooves 24 and 25, respectively. For example, the distances $L_1$ and $L_2$ are 43 nm and 47 nm, respectively, and the difference between the distances $L_1$ and $L_2$ is 4 nm, corresponding to the thickness of the AlGaAs layer 14.

Figure 4F:
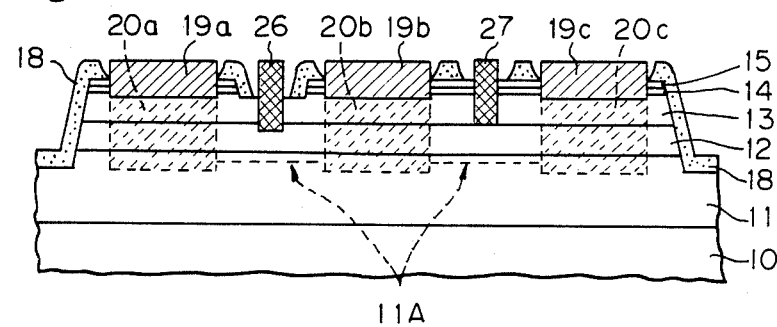

As illustrated in FIG. 4F, gate electrodes 26 and 27 forming a Schottky barrier are formed in the grooves 24 and 25 by depositing metal, such as Ti/Pt/Au and Al, and patterning the deposited metal by a lift-off method. Thus, the gate electrode 26 of the enhancement-mode transistor and the gate electrode 27 of the depletion-mode transistor are simultaneously completed, and a two-dimensional electron gas 11A is generated in the undoped GaAs layer 11 at the heterojunction between the alloyed regions 20a, 20b, and 20c.

Figure 4G:
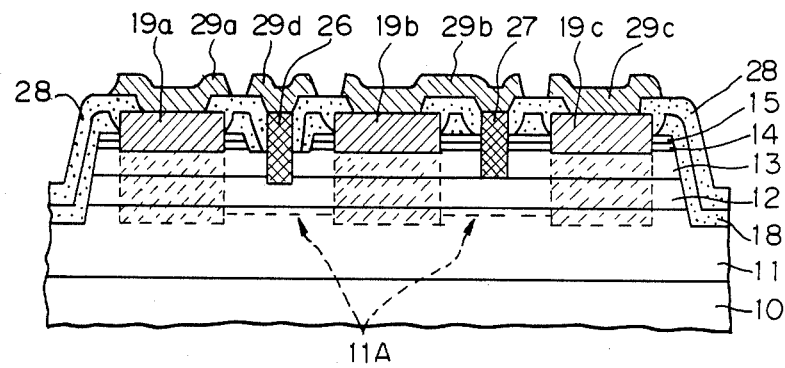

As illustrated in FIG. 4G, an insulating film 28, e.g., of SiO$_2$, is deposited on the entire exposed surface and is selectively etched to form contact holes. Then internal connector lines 29a, 29b, 29c, and 29d are formed by depositing metal such as Au, Ti/Au, Ti/Pt/Au, Cr/Au, and Al and patterning the metal. Thus, an inverter having the circuit of FIG. 2 is completed.

In the above-mentioned embodiment of the present invention, the channel layer 11 is made of GaAs and the electron-supply layer 12 is made of AlGaAs. However, if the electron affinity of the upper layer 12 is greater than that of the lower layer 11 and the lattice constant of the upper layer 12 is equal or similar to that of the lower layer 11, germanium (Ge), indium-antimonide (InSb), or indium-arsenide (InAs) may be used for the lower layer 11 and AlGaAs, GaAs, cadmium-telluride (CdTe), or gallium-antimonide (GaSb) may be used for the upper layer 12. It is possible to use combinations of Ge (lower layer) and AlGaAs (upper layer), Ge and GaAs, InSb and CdTe, and InAs and GaSb in addition to the above-mentioned combination of GaAs and AlGaAs. The layers 13 and 15 may be made of Ge, InSb, or InAs, and the layer 14 may be made of AlGaAs, CdTe, or GaSb. It is possible to adopt a suitable etchant in accordance with compound semiconductor materials used for a semiconductor device according to the present invention.

Figure 2:
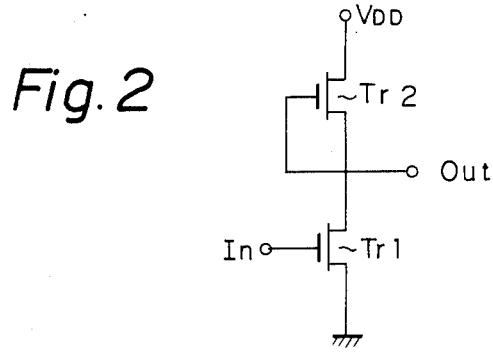
FIG. 2 is an inverter circuit of the semiconductor device of FIG. 1.
Figure 6A:
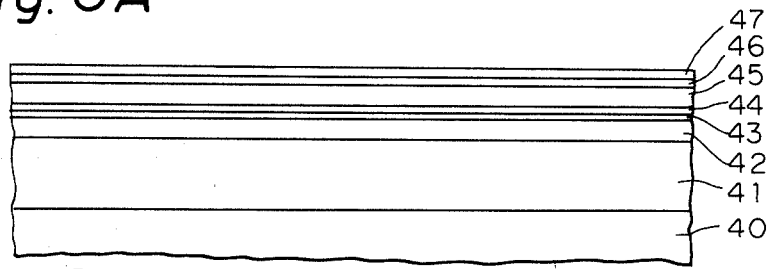
FIGS. 6A through 6G are schematic sectional views of a semiconductor device comprising an enhancement-mode transistor and a depletion-mode transistor in various stages of production in accordance with another embodiment of the present invention.
Figure 6B:
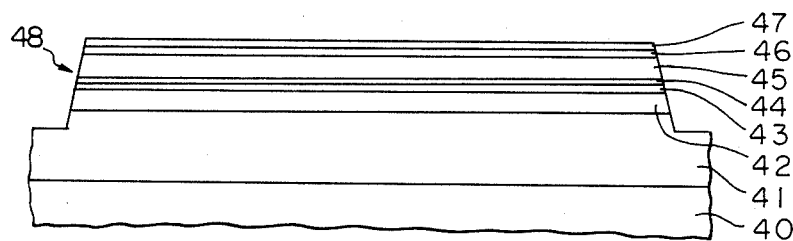
Figure 6C:
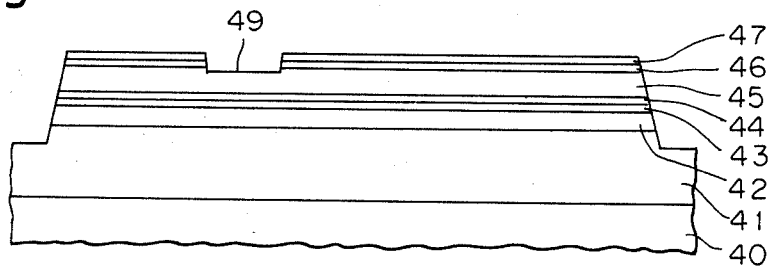
Figure 6D:
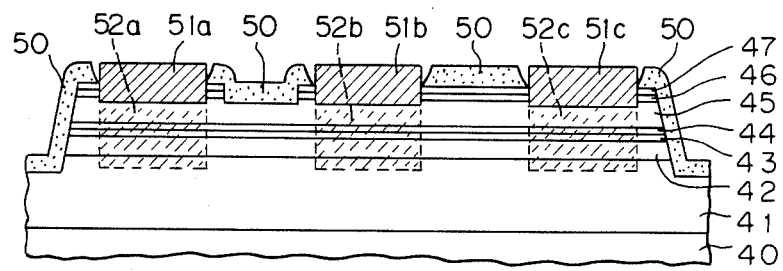
Figure 6E:
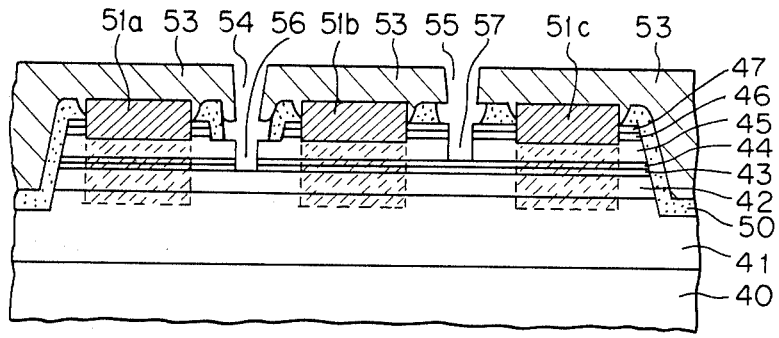
Figure 6F:
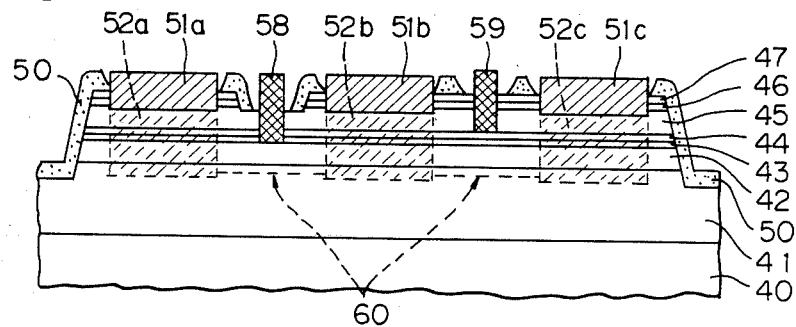
Figure 6G:
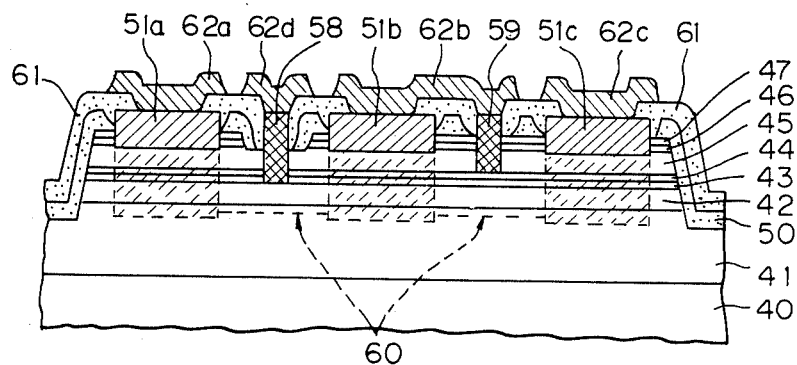

Referring to FIGS. 6A through 6G and 7A and 7B, a semiconductor device (inverter) having the circuit of FIG. 2 and a method of producing the device according to a second embodiment of the present invention are now explained. The structure of the semiconductor device of FIG. 6G is similar to that of the device of FIG. 4G except that two layers 43 and 44 are additionally formed on an N-type AlGaAs electron-supply layer 42. A feature of this embodiment makes the difference in distance between $L_3$ and $L_4$ of FIG. 7B larger than that of $L_1$ and $L_2$ of the above-mentioned first embodiment without increasing the etching time. The semiconductor device of the second embodiment is useful for making the difference of the gate threshold voltage of an enhancement-mode transistor and a depletion-mode transistor large or for decreasing the gate capacitance of both of the transistors by reducing the impurity concentration of both.

As illustrated in FIG. 6A, on a semi-insulating GaAs substrate 40, an undoped GaAs channel layer 41 having a thickness of from 0.1 to 0.3 $\mu$m is epitaxially formed. An N-type AlGaAs electron-supply layer 42 is epitaxially grown on the undoped GaAs layer 41 to form a heterojunction with the GaAs layer 41. The N-type Al$_x$Ga$_{1-x}$As layer 42 (x=0.3) is doped with Si impurities of a dose of from $1 \times 10^{17}$ to $2 \times 10^{18}$ cm$^{-3}$ and has a thickness corresponding to the distance $L_3$, e.g. 44 to 10 nm, between the heterojunction interface and the bottom of a groove 56 (FIG. 6E), i.e., the gate electrode of the enhancement-mode transistor. In accordance with the second embodiment of the present invention, an N-type GaAs layer 43 and an N-type AlGaAs layer 44 are continuously formed on the AlGaAs layer 42. The total thickness of the layers 43 and 44 corresponds to the difference ($L_4-L_3$) between the distances $L_3$ and $L_4$ from the heterojunction interface to the bottom of the grooves (i.e., gate electrodes) of the enhancement-mode transistor and the depletion-mode transistor e.g., 10 nm or more. For example, the GaAs layer 43 is doped with Si impurities of from $1 \times 10^{17}$ to $2 \times 10^{18}$ cm$^{-3}$ and has a thickness of up to 20 nm, e.g., 6 nm. The AlGaAs layer 44 is also doped with Si impurities of from $1 \times 10^{17}$ to $2 \times 10^{18}$ cm$^{-3}$ and has a thickness of, e.g., 4 nm. Then an N-type GaAs layer 45 is epitaxially grown on the AlGaAs layer 44. The GaAs layer 45 has a thickness of, e.g., approximately 100 nm, and is doped with Si impurities of from $1 \times 10^{17}$ to $2 \times 10^{18}$ cm$^{-3}$. An N-type AlGaAs layer 46 having a thickness equal to that of the AlGaAs layer 44, e.g., 4 nm, and an N-type GaAs cap-protecting layer 47 are epitaxially formed on the GaAs layer 45. The layers 41 to 47 are formed by the MBE method or the MOCVD method.

As illustrated in FIG. 6B, the formed layers 41 to 47 are selectively etched by a suitable etching method so as to form an isolated mesa portion 48 in which transistors are formed. Namely, isolation between elements is attained.

As illustrated in FIG. 6C, portions of the GaAs layer 47 and the AlGaAs layer 46 corresponding to a gate region of the enhancement-mode transistor are selectively etched to form a recess 49. In this etching step, a small portion of the N-type GaAs layer 45 may be etched.

As illustrated in FIG. 6D, an insulating material such as SiO$_2$ is applied on the entire exposed surface to form an insulating protector film 50. The film 50 is selectively etched by a lithograph method to form openings for source and drain electrodes. The GaAs layer 47, the AlGaAs layer 46, and the GaAs layer 45 are etched through the openings by a suitable etching method. Ohmic contact electrodes (i.e., source and drain electrodes) 51a, 51b, and 51c are formed in the openings by depositing metal such as AuGe/Au and patterning the metal layer by, e.g., a lift-off method. A heat treatment for alloying is carried out to form alloyed regions 52a, 52b, and 52c coming into ohmic contact with a two-dimensional electron gas layer.

As illustrated in FIG. 6E, a resist film (e.g., a positive photoresist film) 53 is applied on the entire exposed surface and is patterned to form openings 54 and 55 corresponding to gate regions of the transistors. The insulating protector film 50 is etched through the openings 54 and 55 with a suitable etchant. Then a groove 56 for the gate electrode of the enhancement-mode transistor and groove 57 for the gate electrode of the depletion-mode transistor are formed by the above-mentioned reactive ion etching method using CCl$_2$F$_2$ gas and He gas.

Figures 7A, 7B:
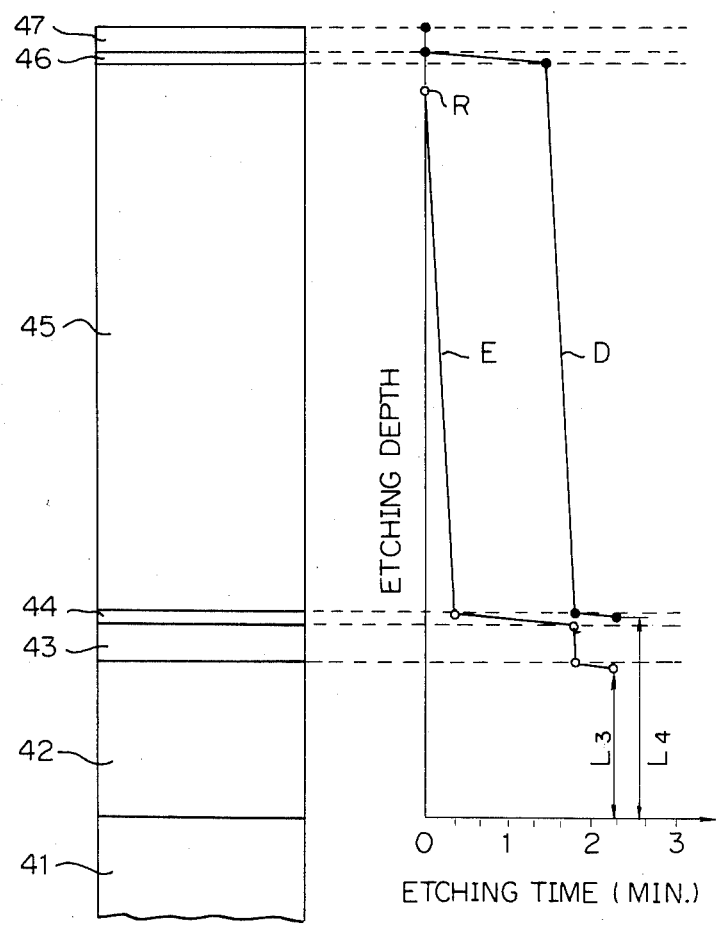
FIG. 7A is a schematic layer structure of another embodiment of the present invention.
FIG. 7B is a graph showing the etching process.

The progress of the etching depth in the reactive ion etching step is shown in FIGS. 7A and 7B. In FIG. 7B, the slanted lines E and D indicate the grooves for the gate electrodes of the enhancement-mode and depletion-mode transistors, respectively. The point R indicates the depth of the recess 49 (FIG. 6C). Since the etching rate of GaAs is much higher than that of AlGaAs, as mentioned in the first embodiment, and the thickness of the AlGaAs layer 46 is equal to that of the AlGaAs layer 44, the formation of the groove 56 at the AlGaAs layer 42 is almost simultaneous with the formation of the groove 57 at the AlGaAs layer 44. Thereafter, the etching proceeds at a very slow rate in both of the AlGaAs layers 42 and 44. As a result of etching, the grooves 56 and 57 are simultaneously completed so as to attain predetermined distances $L_3$ and $L_4$ (FIG. 7B). For example, the distances $L_3$ and $L_4$ are 43 nm and 53 nm, respectively, and the difference between the distances $L_3$ and $L_4$ is 10 nm, corresponding to the total thickness of the layers 43 and 44.

As illustrated in FIG. 6F, gate electrodes 58 and 59 are formed in the grooves 56 and 57 by depositing metal such as Ti/Pt/Au and Al and patterning it. Thus, the gate electrode 58 of the enhancement-mode transistor and the gate electrode 59 of the depletion-mode transistor are simultaneously completed, and a two-dimensional electron gas 60 is generated in the undoped GaAs layer 41 at the heterojunction between the alloyed regions 52a, 52b, and 52c.

As illustrated in FIG. 6G, an insulating film 61, e.g., of $SiO_2$, is deposited on the entire exposed surface and is selectively etched to form contact holes. Then conductor lines 62a, 62b, 62c, and 62d are formed by a conventional process. Thus, the inverter comprising enhancement-mode and depletion-mode heterojunction-type field-effect transistors is completed.

According to the present invention, it is possible to carry out the formation of grooves having different depths for the enhancement-mode transistor and the depletion-mode transistor simultaneously, i.e., by an etching step. Since the bottom of the grooves is an AlGaAs layer in which the etching rate is very slow, the depth of the grooves, i.e., the distance from the heterojunction interface to the bottom of the gate electrodes, can be easily and accurately controlled. Therefore, a good uniformity of the gate threshold voltages of the enhancement-mode and depletion-mode transistors in a substrate (wafer) can be obtained, thereby contributing to an increase in the production yield.

It will be obvious that the present invention is not restricted to the above-mentioned embodiments and that many variations are possible for those skilled in the art without departing from the scope of the present invention.

We claim:

1. A semiconductor device which comprises an enhancement-mode transistor and a depletion-mode transistor, has a heterojunction, and utilizes a two-dimensional electron gas, comprising:
   a semi-insulating compound semiconductor substrate;
   a semiconductor channel layer which is formed on said substrate and in which the two-dimensional electron gas is generated;
   an electron-supply layer formed on said semiconductor layer, which layers form the heterojunction;
   a first semiconductor layer formed on said electron-supply layer and having a composition different from said electron-supply layer;
   a second semiconductor layer formed on said first semiconductor layer, having a thickness for providing a predetermined difference of the threshold voltage between the enhancement-mode transistor and the depletion-mode transistor, said second semiconductor layer having a composition different from said first semiconductor layer and having an etching rate for a certain etchant the same as that of the composition of said electron-supply layer;
   a gate electrode of the depletion-mode transistor located on said electron-supply layer; and
   a gate electrode of the enhancement-mode transistor extending into said electron-supply layer by a depth corresponding to the thickness of said second semiconductor layer.

2. A semiconductor device according to claim 1, wherein said first semiconductor layer is composed of a composition that has an etching rate substantially higher than that of the composition of said electron-supply layer and second semiconductor layer for the same etchant.

3. A semiconductor device according to claim 1, wherein said semiconductor channel layer and said first semiconductor layer are of a material selected from the group consisting of gallium-arsenide, germanium, indium-antimonide, and indium-arsenide.

4. A semiconductor device according to claim 1, wherein said electron-supply layer and said second semiconductor layer are of a material selected from the group consisting of aluminum-gallium-arsenide, gallium-arsenide, cadmium-telluride, and gallium-antimonide.

5. A semiconductor device according to claim 1, wherein said substrate is of semi-insulating gallium-arsenic, said semiconductor channel layer is of undoped gallium-arsenide, said electron-supply layer is of N-type aluminum-gallium-arsenide, said first semiconductor layer is of N-type gallium-arsenide, and said second semiconductor layer is of aluminum-gallium-arsenide.

6. A semiconductor device according to claim 1, further comprising a cap layer formed on said second semiconductor layer.

7. A semiconductor device according to claim 6, wherein said cap layer is of gallium-arsenide.

8. A semiconductor device which comprises an enhancement-mode transistor and a depletion-mode transistor, has a heterojunction, and utilizes a two-dimensional electron gas, comprising:
   a semi-insulating compound semiconductor substrate; (40);
   a semiconductor channel layer which (41) is formed on said substrate and in which the two-dimensional electron gas is generated;
   an electron-supply layer (42) formed on said semiconductor channel layer (41) which layers (41 and 42) form the heterojunction;
   a third doped semiconductor layer (43) formed on said electron-supply layer (42), having a composition different from said electron-supply layer;
   a fourth doped semiconductor layer (44) formed on said third semiconductor layer (43) and being composed of a composition that has the same etching rate as that of the composition of the electron-supply layer (42) for a certain etchant, the total thickness of the third and fourth semiconductor layers (43, 44) providing a predetermined difference of the threshold voltage between the enhancement-mode transistor and the depletion-mode transistor;
   a first semiconductor layer (45) formed on the fourth semiconductor layer (44) and being composed of a composition that has the same etching rate as that of the composition of the third semiconductor layer (43) for the same etchant;
   a second semiconductor layer (46) formed on said first semiconductor layer (45) and having a composition that has the same etching rate as the fourth semiconductor layer for the same etchant;
   a gate electrode (59) of the depletion-mode transistor being located on said fourth semiconductor layer (44);
   a gate electrode (58) of the enhancement-mode transistor being located on said electron supply layer (42) such that said gate electrode (58) of the enhancement-mode transistor extends further than said gate electrode (59) of said depletion-mode transistor by a distance substantially equal to said total thickness of said third and fourth semiconductor layers (43, 44); and contact electrodes (51a, 51b, 51c) being formed on said first semiconductor layer (45) at both sides of each of the gate electrodes (58, 59).

9. A semiconductor device according to claim 8, wherein said first and third semiconductor layers are of a first composition, said second and fourth semiconductor layers and electron-supply layer are of a second composition, and said first composition has an etching rate substantially higher than the etching rate of the second composition.

10. A semiconductor device according to claim 9, wherein said substrate is of gallium-arsenide, said channel layer is of gallium-arsenide, said electron-supply layer and fourth and second semiconductor layers are of aluminum-gallium-arsenide, and said third and first semiconductor layers are of gallium-arsenide.

* * * * *